US010116401B2

(12) United States Patent
Tsukamoto

(10) Patent No.: US 10,116,401 B2
(45) Date of Patent: Oct. 30, 2018

(54) ELECTROMAGNETIC RADIO INTERFERENCE MEASUREMENT DEVICE, ELECTROMAGNETIC RADIO INTERFERENCE MEASUREMENT METHOD, AND ELECTROMAGNETIC RADIO INTERFERENCE MEASUREMENT-PROGRAM RECORDING MEDIUM

(71) Applicant: NEC CORPORATION, Tokyo (JP)

(72) Inventor: Kenta Tsukamoto, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 116 days.

(21) Appl. No.: 15/327,275

(22) PCT Filed: Jul. 17, 2015

(86) PCT No.: PCT/JP2015/003613
§ 371 (c)(1),
(2) Date: Jan. 18, 2017

(87) PCT Pub. No.: WO2016/013190
PCT Pub. Date: Jan. 28, 2016

(65) Prior Publication Data
US 2017/0180065 A1 Jun. 22, 2017

(30) Foreign Application Priority Data
Jul. 23, 2014 (JP) .................................. 2014-149586

(51) Int. Cl.
*H04B 17/345* (2015.01)
*G01R 29/08* (2006.01)
(Continued)

(52) U.S. Cl.
CPC ........... *H04B 17/345* (2015.01); *G01R 29/08* (2013.01); *H04W 4/80* (2018.02); *H04W 24/08* (2013.01)

(58) Field of Classification Search
None
See application file for complete search history.

(56) References Cited

U.S. PATENT DOCUMENTS

| 6,509,728 B1 * | 1/2003 | Uchino | G01R 23/16 |
| | | | 324/76.13 |
| 2004/0167737 A1 * | 8/2004 | Yamane | H03B 29/00 |
| | | | 702/107 |

(Continued)

FOREIGN PATENT DOCUMENTS

| CN | 101019033 A | 8/2007 |
| CN | 101103574 A | 1/2008 |

(Continued)

OTHER PUBLICATIONS

Kaoru Goto, et al., "Electromagnetic Disturbance Measurement by Using Amplitude Probability Distribution for Protecting Digital Wireless Communication Systems", Journal of the National Institute of Information and Communications Technology, 2006, pp. 81-90, vol. 53, No. 1.

(Continued)

*Primary Examiner* — Duc T Duong
(74) *Attorney, Agent, or Firm* — Sughrue Mion, PLLC

(57) ABSTRACT

A device that measures an electromagnetic near-field emitted from a measurement object and evaluates electromagnetic interference, the device including mask setting unit that converts a predetermined communication performance value into an amplitude probability distribution mask and setting a converted amplitude probability distribution mask as a permissible level; acquisition unit that acquires time-series measurement data of electromagnetic radio interfer- (Continued)

ence in connection with a measurement position coordinate; amplitude probability distribution calculation unit that calculates an amplitude probability distribution of the electromagnetic radio interference for each measurement position coordinate based on the time-series measurement data; determination unit that determines a magnitude relation between the amplitude probability distribution mask and the amplitude probability distribution for each measurement position coordinate and outputting as a determination result; and mapping process unit that acquires a mapping result in which the determination result is reflected in a space corresponding to the measurement object.

9 Claims, 9 Drawing Sheets

(51) Int. Cl.
*G01R 33/02* (2006.01)
*H04W 4/80* (2018.01)
*H04W 24/08* (2009.01)

(56) References Cited

U.S. PATENT DOCUMENTS

| 2009/0006011 A1* | 1/2009 | Kazawa | G01R 29/0871 |
| | | | 702/57 |
| 2011/0125429 A1 | 5/2011 | Kazama et al. | |
| 2012/0021710 A1* | 1/2012 | Tsukamoto | H04B 17/327 |
| | | | 455/226.1 |
| 2012/0310583 A1* | 12/2012 | Ronte | G01R 23/16 |
| | | | 702/116 |
| 2014/0148113 A1* | 5/2014 | Choi | H04B 1/1027 |
| | | | 455/226.1 |

FOREIGN PATENT DOCUMENTS

| EP | 1 837 666 A1 | 9/2007 |
| JP | 2000-266792 A | 9/2000 |
| JP | 2010-96658 A | 4/2010 |
| JP | 2011-17718 A | 1/2011 |
| JP | 2011-117729 A | 6/2011 |
| JP | 2011-135161 A | 7/2011 |
| KR | 10-2007-0072552 A | 7/2007 |
| KR | 10-0976146 B1 | 8/2010 |
| WO | 2006/075584 A1 | 7/2006 |
| WO | 2014/065032 A1 | 5/2014 |

OTHER PUBLICATIONS

International Search Report of PCT/JP2015/003613, dated Sep. 29, 2015. [PCT/ISA/210].
Written Opinion of PCT/JP2015/003613, dated Sep. 29, 2015. [PCT/ISA/237].

* cited by examiner

Fig. 9
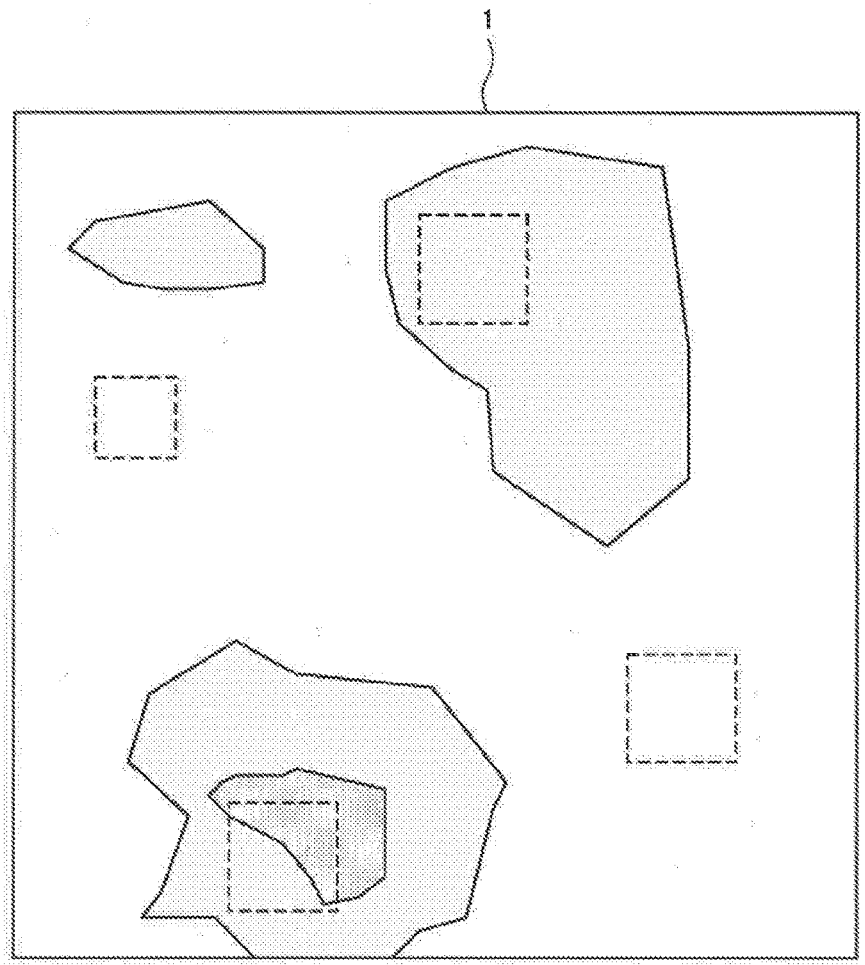
 RADIO INTERFERENCE PERMISSIBLE LOCATION
 MSK/BPSK/QPSK
NG LOCATION
 16QAM
NG LOCATION

ELECTROMAGNETIC RADIO INTERFERENCE MEASUREMENT DEVICE, ELECTROMAGNETIC RADIO INTERFERENCE MEASUREMENT METHOD, AND ELECTROMAGNETIC RADIO INTERFERENCE MEASUREMENT-PROGRAM RECORDING MEDIUM

CROSS REFERENCE TO RELATED APPLICATIONS

This application is a National Stage of International Application No. PCT/JP2015/003613 filed Jul. 17, 2015, claiming priority based on Japanese Patent Application No. 2014-149586filed Jul. 23, 2014, the contents of all of which are incorporated herein by reference in their entirety.

TECHNICAL FIELD

The present invention relates to an electromagnetic radio interference measurement device, an electromagnetic radio interference measurement method, and an electromagnetic radio interference measurement program and in particular, relates to an electromagnetic radio interference measurement device which measures a electromagnetic near-field emitted from a measurement object and evaluates electromagnetic interference, an electromagnetic radio interface measurement method, and an electromagnetic interference wave measurement-program recording medium.

BACKGROUND ART

In recent years, demand for utilization of a radio wave for mobile communication increases. In contrast, wireless communication interference in a cell phone, a wireless LAN (Local Area Network), or the like and a radio disturbance in a TV set, a radio set, or the like frequently occur by electromagnetic interference of radio interference in a frequency band of a radio wave used in mobile communication. Such radio interference is emitted from various electronic devices that operate as noise generation sources and is a factor which causes electromagnetic interference of a wireless communication device that exists in the neighborhood of the noise generation source or the electronic device itself that is the noise generation source generating the radio interference. For this reason, it is strongly required to suppress the emission of the radio interference generated by the electronic device in order to ensure the communication quality.

When a substrate on which an electronic component is mounted is designed and developed, the electromagnetic near-field is measured in order to identify the radio interference generation source which causes the electromagnetic failure. In the electromagnetic near-field measurement, the neighborhood on the surface of the substrate is scanned by using an electromagnetic field probe, a frequency characteristic in the electromagnetic field is sequentially obtained at each measurement point, and a point at which the noise intensity is high is detected.

In the general electromagnetic near-field measurement, a maximum value or an average value of the intensity of the radio interference is measured at a measurement frequency by using a spectrum analyzer. However, in many cases, the intensity of the radio interference varies over time. Accordingly, it is difficult to correctly evaluate the electromagnetic radio interference by using the above-mentioned evaluation method using a single parameter.

Accordingly, an amplitude probability distribution measurement is proposed as a method to evaluate the variation of the radio interference over time and an influence on communication. As shown in Equation (1), the amplitude probability distribution (APD) is a statistical parameter calculated by using a ratio of a time $T_i$ in which an amplitude envelope line exceeds an amplitude value $E_k$ specified in advance to a total measurement time T based on the time-series measurement data of the obtained radio interference amplitude values. Because the amplitude probability distribution indicates a relation between an occurrence frequency of noise and an amplitude intensity, it is useful as a measure to evaluate the radio interference to the digital noise. By measuring this amplitude probability distribution, the influence of the noise that varies over time can be grasped.

[Equation 1]

$$APD(E_k) = \frac{\sum_{i=1}^{h} T_i(E_k)}{T} \quad (1)$$

Further, as described in patent literature 1, the amplitude probability distribution has a high correlation with a bit error rate before error correction in the communication evaluation. Accordingly, an influence of the radio interference on a digital wireless communication system existing in the neighborhood of the radio interference generation source can be estimated based on the amplitude probability distribution under a predetermined specific condition. Here, the specific condition is a condition in which an internal noise level of a measuring instrument is equal to an internal noise level of a receiver, a receiver uses a synchronous detection method, the communication bandwidth of a communication system is equal to a measurement bandwidth, and the like.

Further, in patent literature 2, there is described a spectrum analyzer which measures the amplitude probability distribution of the radio interference. Such spectrum analyzer with a function to measure the amplitude probability distribution or a measurement device with a function to measure a CCDF that is also an radio interference parameter similar to the amplitude probability distribution measures the amplitude intensity of the radio interference in the set measurement bandwidth and obtains the amplitude probability distribution or the CCDF by an arithmetic processing. The CCDF described above is the abbreviation for Complementary Cumulative Distribution Function.

Further, in patent literature 3, there is described an electromagnetic field distribution measurement method taking into account the variation of the measurement value over time which can measure the electromagnetic field distribution by the amplitude probability distribution.

By using the technology described in patent literature 1 to patent literature 3, the amplitude probability distribution of the electromagnetic radio interference can be measured with a high accuracy.

Here, in order to evaluate the influence of the electromagnetic radio interference on the communication system, it is necessary to compare with a desired communication performance value which gives an permissible limit value. As this communication performance value, for example, a desired bit error rate at a predetermined signal intensity that is determined in advance can be used. However, it takes much time for the measurement value of the bit error rate to become a reliable value. Therefore, it is difficult for a user to grasp the influence of the electromagnetic radio interference on the communication system immediately.

In patent literature 4, there is described a method in which the amplitude probability distribution of the predetermined electromagnetic radio interference and the bit error rate under the influence of the radio interference are measured in advance, the amplitude probability distribution and the bit error rate are associated with each other and stored, the amplitude probability distribution data similar to the amplitude probability distribution that is newly measured is searched for from a storage medium, and the influence on the communication system is grasped.

CITATION LIST

Patent Literature

[PTL 1] Japanese Patent Application Laid-Open No. 2011-135161 (page 6 to page 7)
[PTL 2] Japanese Patent Application Laid-Open No. 2000-266792 (page 6 to page 9)
[PTL 3] Japanese Patent Application Laid-Open No. 2011-017718 (page 12 to page 13)
[PTL 4] Japanese Patent Application Laid-Open No. 2010-096658 (page 3 to page 4)

SUMMARY OF INVENTION

Technical Problem

However, when the method in which the amplitude probability distribution of the radio interference and the bit error rate are associated with each other is used, there is a possibility that the evaluation accuracy becomes low when the radio interference wave that is different from the data stored in advance is detected. Further, in order to perform the evaluation with a high accuracy, it is necessary to input an enormous number of associated data. Therefore, a problem in which it takes much time to input the data and also search for the data occurs. In order to enable a user to immediately evaluate the influence of the electromagnetic radio interference on the communication system, the radio interference measurement and the evaluation of whether or not the measured value meets the desired communication performance value (bit error rate or the like) which gives the permissible limit value have to be performed at the same time.

Further, in the wireless communication system such as an LTE (Long Term Evolution) or the like in which a plurality of modulation methods are selectively used according to a communication environment, the desired communication performance value permitted in the wireless communication system is different for each modulation method. Therefore, it becomes more difficult to grasp the influence of the electromagnetic radio interference on the communication system with a high accuracy.

An object of the present invention is to solve the above-mentioned problem and provide an electromagnetic radio interference measurement device which can correctly and easily identify a source generating the electromagnetic radio interference that has an influence on the desired communication performance in a measurement object, an electromagnetic radio interference measurement method, and an electromagnetic radio interference measurement-program recording medium.

Solution to Problem

An electromagnetic radio interference measurement device that measures an electromagnetic near-field emitted from a measurement object and evaluates electromagnetic interference, the device comprising:

mask setting means for converting a predetermined communication performance value permitted in a desired communication system or a modulation method that is arbitrarily designated into an amplitude probability distribution mask and setting a converted amplitude probability distribution mask as a permissible level;

acquisition means for acquiring time-series measurement data of electromagnetic radio interference emitted from the measurement object in connection with a measurement position coordinate;

amplitude probability distribution calculation means for calculating amplitude probability distribution of the electromagnetic radio interference for each measurement position coordinate based on the measurement data;

determination means for determining a magnitude relation between the amplitude probability distribution mask and the amplitude probability distribution for each measurement position coordinate and outputting as a determination result;

mapping process means for acquiring a mapping result in which the determination result is reflected in a space corresponding to the measurement object, and output means for outputting the mapping result.

An electromagnetic radio interference measurement method of the present invention is the electromagnetic radio interference measurement method used in an electromagnetic radio interference measurement device which measures a electromagnetic near-field emitted from a measurement object and evaluates electromagnetic interference characterized by comprising:

converting a predetermined communication performance value permitted in a desired communication system or a modulation method that is arbitrarily designated into an amplitude probability distribution mask; setting the converted amplitude probability distribution mask to a permissible level;

associating time-series measurement data of the electromagnetic radio interference emitted from the measurement object with a measurement position coordinate and acquiring it; calculating an amplitude probability distribution of the electromagnetic radio interference for each measurement position coordinate based on the measurement data;

determining a magnitude relation between the amplitude probability distribution mask and the amplitude probability distribution for each measurement position coordinate; outputting a result as a determination result; acquiring a mapping result in which the determination result is reflected in a space corresponding to the measurement object; and outputting the mapping result.

A program recording medium of the present invention which records an electromagnetic radio interference measurement-program is the program recording medium recording a program which causes a computer of an electromagnetic radio interference measurement device which measures a electromagnetic near-field emitted from a measurement object and evaluates electromagnetic interference to perform:

a mask setting process of which a predetermined communication performance value permitted in a desired communication system or a modulation method that is arbitrarily designated is converted into an amplitude probability distribution mask and the converted amplitude probability distribution mask is set to a permissible level, an acquisition process of which time-series measurement data of the electromagnetic radio interference emitted from the measurement object is associated with a measurement position coordinate and it is acquired, an amplitude probability distribution calculation process of which an amplitude probability distribution of the electromagnetic radio interference is calculated for each measurement position coordinate based on the measurement data, a determination process of which a magnitude relation between the amplitude probability distribution mask and the amplitude probability distribution is determined for each measurement position coordinate and a result is outputted as a determination result, a mapping process of which a mapping result in which the determination result is reflected in a space corresponding to the measurement object is acquired, and an output process of which the mapping result is outputted.

Advantageous Effects of Invention

By using the present invention, a source generating the electromagnetic radio interference that has an influence on a desired communication system in a measurement object can be correctly and easily identified.

BRIEF DESCRIPTION OF DRAWINGS

FIG. 9 is a figure showing an example of a mapping result in a third example embodiment.

DESCRIPTION OF EMBODIMENTS

[First Example Embodiment]
(Explanation of Configuration)

Figure 1:
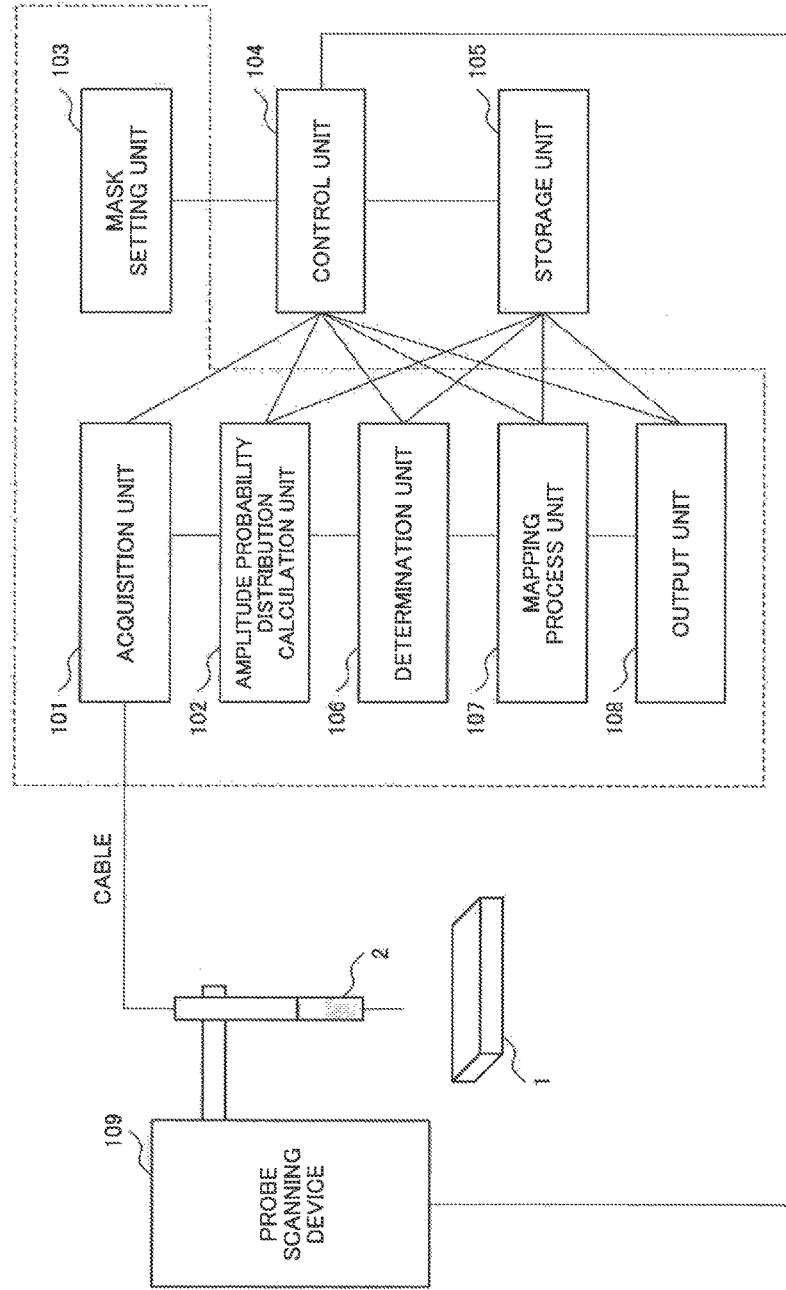
FIG. 1 is a block diagram showing an example of a configuration of an electromagnetic radio interference measurement device according to a first example embodiment of the present invention.

FIG. 1 is a block diagram showing an example of a configuration of an electromagnetic radio interference measurement device 100 according to a first example embodiment of the present invention. Further, in order to make the explanation more clearly, the component less likely to be related to the invention such as an interface circuit or the like is omitted in FIG. 1.

The electromagnetic radio interference measurement device 100 includes an acquisition unit 101, an amplitude probability distribution calculation unit 102, a mask setting unit 103, a control unit 104, a storage unit 105, a determination unit 106, a mapping process unit 107, an output unit 108, and a probe scanning device 109.

A measurement object 1 is for example, a circuit board on which a plurality of integrated circuits (an IC (Integrated Circuit), an LSI (Large Scale Integration), and the like) are mounted.

A probe 2 measures a electromagnetic near-field emitted from the measurement object 1 that includes disturbance such as an electromagnetic radio interference or the like. The probe 2 includes a loop antenna, a dipole antenna, or the like for measuring the electromagnetic near-field. The electromagnetic wave detected by the probe 2 is outputted to the acquisition unit 101 through a cable.

The acquisition unit 101 measures the electromagnetic wave and creates data. In this case, for example, a voltmeter, an electric field strength meter, a spectrum analyzer, or the like that can measure an amplitude of the electromagnetic wave for each frequency is used as a reception interface. The acquisition unit 101 has a function to sample the electromagnetic wave for a predetermined time period determined in advance and repeatedly measure the frequency and the amplitude value of the electromagnetic wave for each measurement position coordinate. Further, the acquisition unit 101 has a function to convert a temporal waveform change of the electromagnetic radio interference emitted from the measurement object 1 into the time series measurement data in digital form. The converted time series measurement data is modified so that it can be divided for each predetermined time period determined in advance and outputted to the amplitude probability distribution calculation unit 102.

The amplitude probability distribution calculation unit 102 calculates the amplitude probability distribution from the time series measurement data inputted from the acquisition unit 101 for each measuring position coordinate. The amplitude probability distribution calculated in the amplitude probability distribution calculation unit 102 is associated for each measuring position coordinate and outputted to at least the determination unit 106.

The mask setting unit 103 converts an permissible bit error rate that is a bit error rate (an example of a communication performance value) permitted in the communication system or the modulation method desired by the user into the amplitude probability distribution mask according to a setting condition. Further, the converted amplitude probability distribution mask is set as an permissible level. The amplitude probability distribution mask converted in the mask setting unit 103 is outputted to, for example, the determination unit 106 via the control unit 104. It is desirable that the setting condition of the mask setting unit 103 can be determined after the user selects the communication system or the modulation method that is desired by the user and inputs the bit error rate permitted in the selected communication system or modulation method from an external input terminal.

Further, of course, a predetermined fixed value specified in the standards or the like can be used for the bit error rate permitted in the communication system or the modulation method instead of the value inputted by the user. For example, in the digital terrestrial television broadcasting system, it is specified that the bit error rate before error correction should be equal to or less than $2 \times 10^{-4}$ at the specified C/N (Channel to Noise) ratio to enable the user to at least view a program. Further, in the WCDMA (Wideband Code Division Multiple Access: registered trademark) system, a minimum reception sensitivity in a condition in which the error rate is equal to or less than $10^{-3}$ is specified by the 3GPP (3rd Generation Partnership Project).

Thus, in the communication system to which the required level is standardized, the amplitude probability distribution mask itself that is the result obtained by converting the specified bit error rate may be held in the storage unit 105 in advance. The mask setting unit 103 may read out the amplitude probability distribution mask of the communication system selected by the user from the storage unit 105 via the control unit 104 and show it together with the amplitude probability distribution showing the measurement result of the electromagnetic radio interference in the measurement object 1.

Further, in a case in which the conversion from the bit error rate into the amplitude probability distribution mask is inappropriate, such as a case in which the measurement bandwidth is not equal to the communication bandwidth of the communication system or the like, the mask setting unit 103 can show an error message indicating that the conversion to the amplitude probability distribution mask is inappropriate.

The amplitude probability distribution calculated by the amplitude probability distribution calculation unit 102 and the amplitude probability distribution mask set by the mask setting unit 103 are inputted into the determination unit 106. The determination unit 106 determines the magnitude relation between the amplitude probability distribution and the amplitude probability distribution mask and outputs a determination result to the mapping process unit 107 and the storage unit 105. The determination result is for example, information indicating whether or not the amplitude probability distribution mask and the amplitude probability distribution of the electromagnetic radio interference overlap each other (namely, information indicating whether or not the actual measurement value of the amplitude probability distribution that is the measurement result of the electromagnetic radio interference is greater than the permissible value of the amplitude probability distribution mask showing an permissible range).

The mapping process unit 107 receives the above-mentioned determination result (the determination result of the magnitude relation) together with the information of the measurement position coordinate from the determination unit 106, sequentially maps the above-mentioned determination result on each measurement position coordinate in a space corresponding to the measurement object 1, and obtains a mapping result.

The output unit 108 displays the mapping result (for example, refer to FIG. 4) received from the mapping process unit 107 in a display device. By displaying the mapping result, the user can grasp the position of the radio interference generation source which does not satisfy the permissible value in the measurement object 1.

Further, the output unit 108 can print out the mapping result from a printer device and if necessary, output it to an external display device. Further, the output unit 108 can have a function to transmit the mapping result to another information processing system. By this function, even in the another information processing system, the position of the radio interference generation source which does not satisfy the permissible value in the measurement object 1 can be grasped.

The probe scanning device 109 controls the probe 2 and a stage on which the measurement object 1 (not shown in FIG. 1) is mounted. The probe scanning device 109 has a structure such that the probe 2 can be moved to the position set by the control unit 104. For example, the probe scanning device 109 has a structure such that the probe 2 can be moved along three axes: in an upper or lower direction, in a left or right direction, and in a front or rear direction. Further, the probe scanning device 109 can have a structure such that it can scan a double-sided board. Specifically, for example, the probe scanning device 109 can have a structure such that the surface to be scanned of the measurement object 1 can be changed by turning over the measurement object 1 or a structure in which the probe 2 can be moved to both sides of the double-sided board to scan the surfaces to be scanned of the measurement object 1.

When the electromagnetic wave measurement starts, first, the control unit 104 controls the probe scanning device 109 for moving the probe 2 to a measurement start position. The control unit 104 outputs a measurement start signal that is a start signal for measuring the electromagnetic wave and a measurement condition to the acquisition unit 101. After this operation, the control unit 104 performs a series of processes (in other words, an electromagnetic wave measurement) mentioned above by appropriately controlling each processing unit. For example, the amplitude probability distribution mask set by the mask setting unit 103 is outputted to the storage unit 105 and the output unit 108 via the control unit 104. Further, the control unit 104 can operate the measurement object 1 in cooperation with the electromagnetic wave measurement.

(Explanation of Operation)

An example of the operation of the electromagnetic radio interference measurement device 100 will be described.

Figure 2:
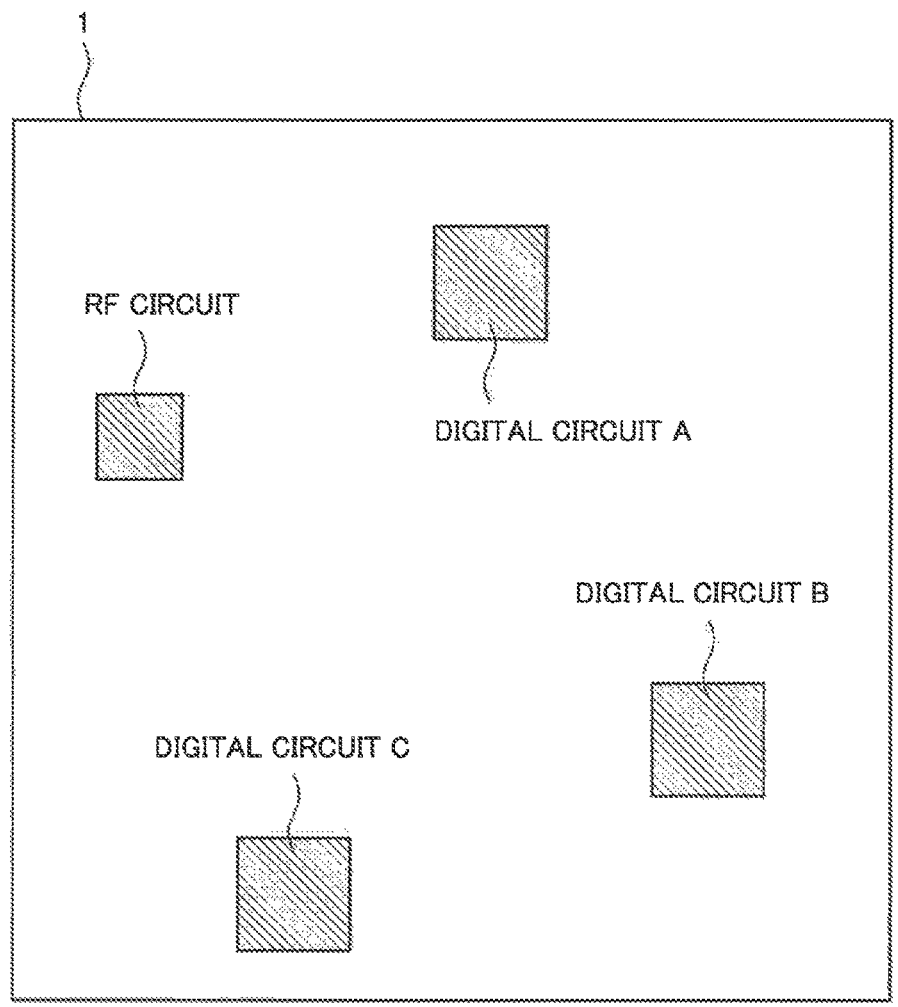
FIG. 2 shows a specific example of a measurement object.

FIG. 2 shows a specific example of the measurement object 1. In this case, the measurement object 1 is a wireless communication board on which three LSIs (a digital circuit A, a digital circuit B, and a digital circuit C) and one RF (Radio Frequency) circuit are mounted.

As described above, the electromagnetic radio interference measurement device 100 measures the electromagnetic near-field above the wireless communication board with a desired resolution. The amplitude probability distribution calculation unit 102 calculates the amplitude probability distribution for each measurement position coordinate. On the one hand, the mask setting unit 103 sets the amplitude probability distribution mask. The determination unit 106 is inputted the amplitude probability distribution and the amplitude probability distribution mask and determines the magnitude relation between the amplitude probability distribution and the amplitude probability distribution mask.

Figure 3:
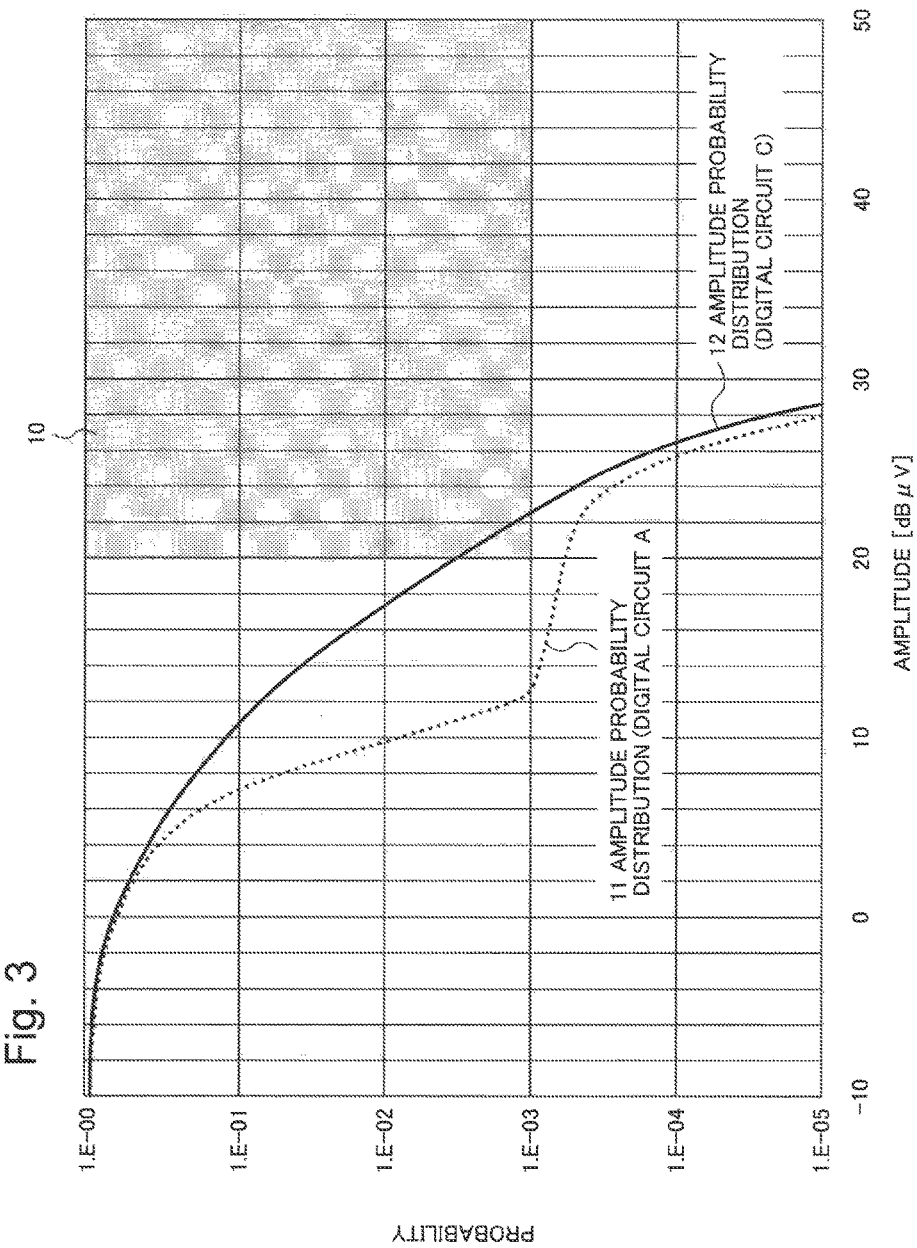
FIG. 3 is a figure showing an image of a magnitude relation determination process performed by a determination unit according to a first example embodiment.

FIG. 3 is a figure showing an image of a magnitude relation determination process performed by the determination unit 106. FIG. 3 shows an amplitude probability distribution 11 in the neighborhood of the digital circuit A and an amplitude probability distribution 12 in the neighborhood of the digital circuit C in the wireless communication board (FIG. 2) that is the measurement object 1. Further, in the upper right part of FIG. 3, an amplitude probability distribution mask 10 calculated from the bit error rate permitted in the wireless communication board is shown. The amplitude probability distribution mask 10 is obtained by converting the bit error rate permitted in the communication system (that is the communication system using the wireless communication board) that is selected/inputted by the user and set. FIG. 3 is a graph of probability versus amplitude.

In FIG. 3, by comparing the amplitude probability distribution 11 with the amplitude probability distribution 12, it is found that the electromagnetic radio interference characteristics in one wireless communication board are different from each other. This is because, for example, the processing loads of the circuits that are the electromagnetic radio interference sources are not equal to each other.

As shown in FIG. 3, the curve line of the amplitude probability distribution 11 in the neighborhood of the digital circuit A and the amplitude probability distribution mask 10 does not overlap each other at all (namely, the amplitude of which the measurement result of the amplitude probability of the electromagnetic radio interference exceeds the permissible upper limit value does not exist at all). In contrast, a part of the curve line of the amplitude probability distribution 12 in the neighborhood of the digital circuit C and the amplitude probability distribution mask 10 overlap each other (namely, the amplitude of which the amplitude probability exceeds the permissible upper limit value barely exists). The determination unit 106 transmits a determination result indicating whether or not the amplitude probability distribution exceeds the amplitude probability distribution mask 10 for each measurement position coordinate to the mapping process unit 107.

The mapping process unit 107 maps the determination result received from the determination unit 106 on each measurement position coordinate in a space corresponding to the wireless communication board that is the measurement object 1 and obtains the mapping result.

Figure 4:
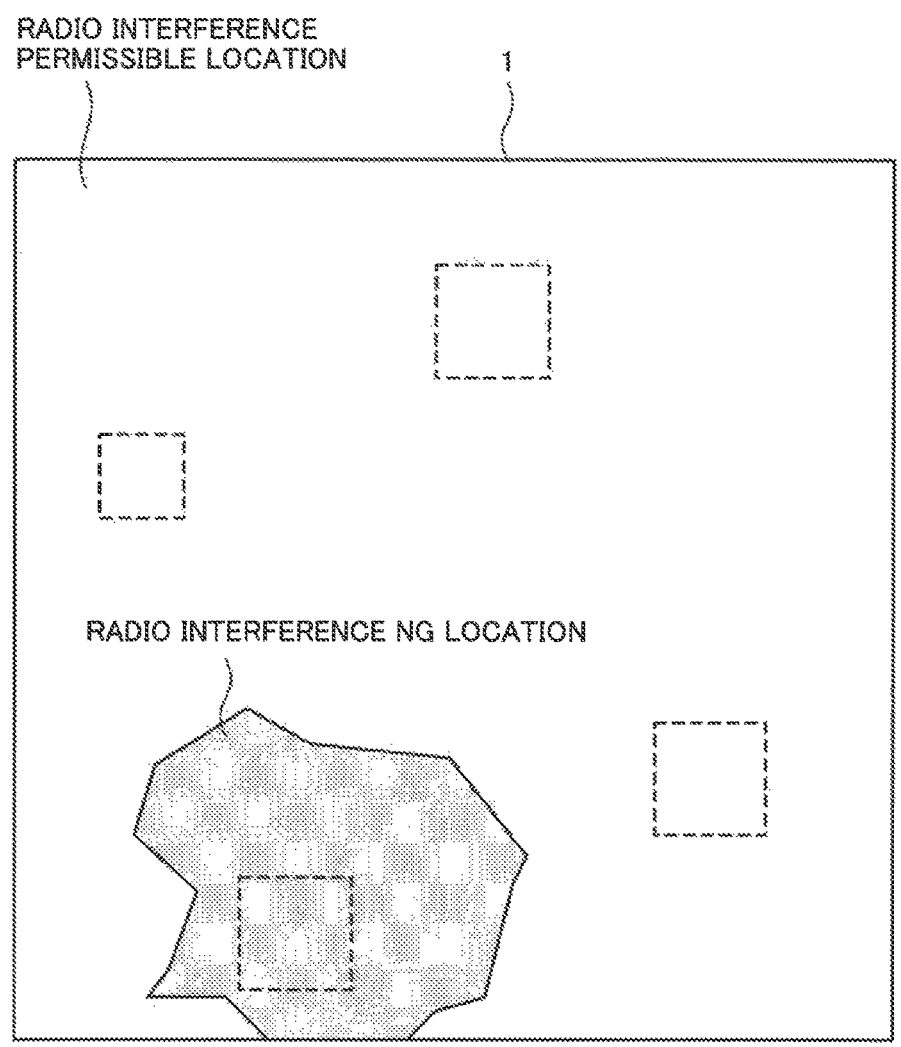
FIG. 4 is a figure showing an example of a mapping result in a first example embodiment.

FIG. 4 is a figure showing an example of the mapping result in the first example embodiment. In the mapping result shown in FIG. 4, two stages of area are shown. A first area is an area ("an radio interference permissible location" in FIG. 4) in which the permissible level indicated by the amplitude probability distribution mask 10 is satisfied. A second area is an area ("an radio interference NG location" in FIG. 4) in which the above-mentioned permissible value level is not satisfied. Specifically, the radio interference NG location is an area in the neighborhood of the digital circuit C and the radio interference permissible location is an area other than the area in the neighborhood of the digital circuit C.

(Explanation of Effect)

In the first example embodiment described above, the mapping result shown in FIG. 4 is shown. Accordingly, the user can correctly and easily identify the electromagnetic radio interference generation source by which the bit error rate is degraded below the permissible value in the area which does not satisfy the permissible value.

When the electromagnetic radio interference generation source can be correctly and easily identified, more effective EMI (Electro Magnetic Interference) measures can be taken. Further, at an early stage of the electromagnetic radio interference measurement, the electromagnetic radio interference measurement taking into account the influence on the bit error rate characteristic can be performed. Therefore, a front-loading of the EMI design and development process can be done and the cost of the product can be reduced.

Further, in the first example embodiment described above, the control unit 104, the storage unit 105, and the probe scanning device 109 are not essential components. These components can be installed at the outside of the electromagnetic radio interference measurement device 100. Namely, the electromagnetic radio interference measurement device 100 may be composed of only the components shown in a section surrounded by a dashed line in FIG. 1.

[Second Example Embodiment]

In the first example embodiment described above, a case in which one amplitude probability distribution mask is used has been described as an example. However, a plurality of the amplitude probability distribution masks can be set.

Specifically, the mask setting unit 103 sets a plurality of different amplitude probability distribution masks obtained by converting a plurality of different bit error rates as the permissible level. The determination unit 106 determines the magnitude relation between a plurality of the amplitude probability distribution masks and the amplitude probability distribution for each measurement position coordinate and outputs a step-by-step determination result. The mapping process unit 107 acquires the mapping result in which the step-by-step determination result is reflected in the space corresponding to the measurement object 1. The output unit 106 displays the mapping result in which the step-by-step determination result received from the mapping process unit 107 is reflected in a display device.

Figure 5:
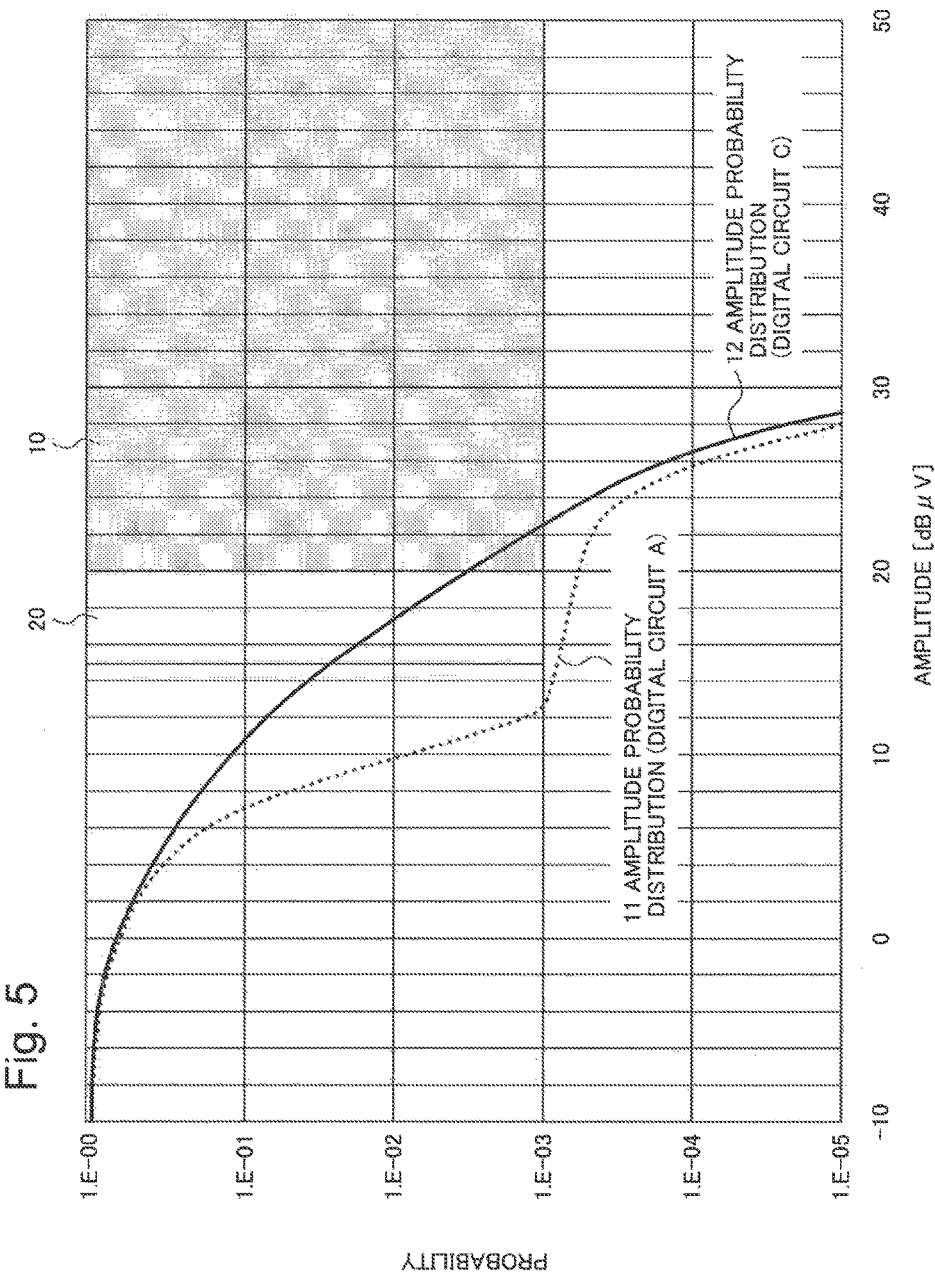
FIG. 5 is a figure showing an image of a magnitude relation determination process performed by a determination unit according to a second example embodiment.

FIG. 5 is a figure showing an image of the magnitude relation determination process performed by the determination unit 106 in the second example embodiment. FIG. 5 shows the amplitude probability distribution 11 in the neighborhood of the digital circuit A and the amplitude probability distribution 12 in the neighborhood of the digital circuit C in the wireless communication board (FIG. 2) that is the measurement object 1 like the example shown in the first example embodiment. In the upper right part of FIG. 5, a plurality of the amplitude probability distribution masks 10 and 20 calculated from the bit error rate permitted in the wireless communication board are shown.

As shown in FIG. 5, the permissible level of the amplitude probability distribution mask 20 is more stringent than that of the amplitude probability distribution mask 10. The curve line of the amplitude probability distribution 11 in the neighborhood of the digital circuit A and the amplitude probability distribution mask 10 does not overlap each other at all. In contrast, a part of the curve line of the amplitude probability distribution 12 in the neighborhood of the digital circuit C and the amplitude probability distribution masks 10 and 20 overlap each other (namely, the amplitude of which the amplitude probability exceeds the permissible upper limit value barely exists). The determination unit 106 transmits the determination result indicating whether or not the amplitude probability distribution exceeds the upper limit value determined by the amplitude probability distribution masks 10 and 20 for each measurement position coordinate to the mapping process unit 107.

In this example, for each of the amplitude probability distribution masks 10 and 20, different amplitudes are set to the same probability. However, for each of a plurality of masks, an arbitrary probability and an arbitrary amplitude may be set.

The mapping process unit 107 maps the determination result obtained by using two masks that is received from the determination unit 106 on each measurement position coordinate on the space corresponding to the wireless communication board that is the measurement object 1 and obtains the mapping result.

Figure 6:
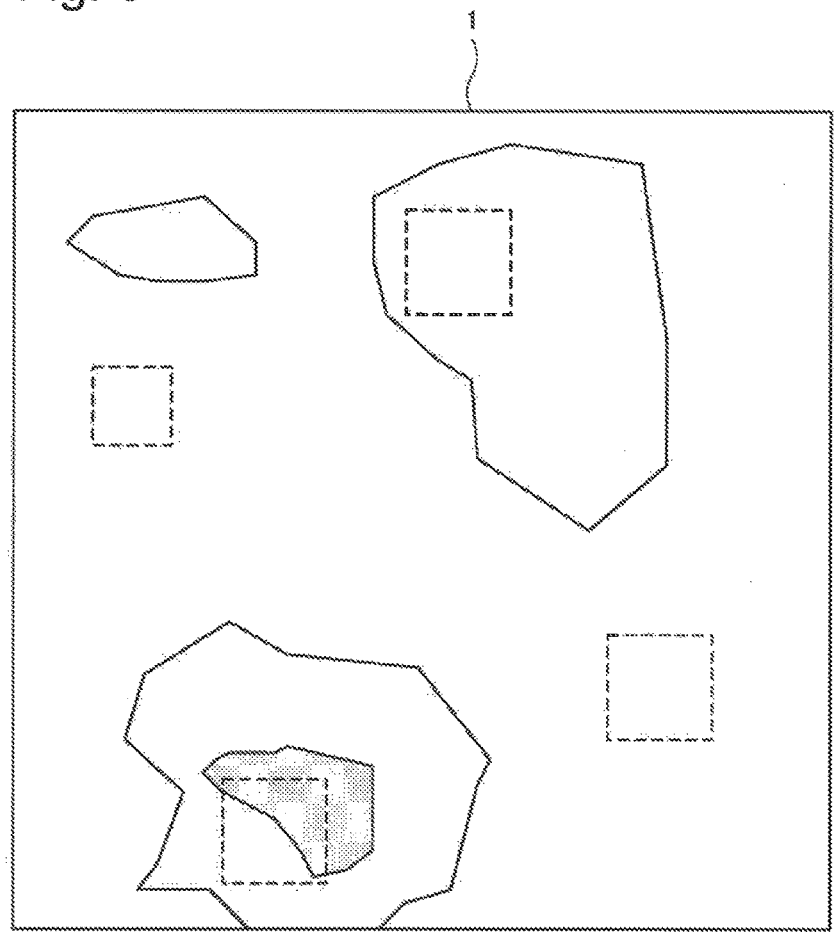
FIG. 6 is a figure showing an example of a mapping result in a second example embodiment.

FIG. 6 is a figure showing an example of the mapping result (the mapping result obtained when two amplitude probability distribution masks are used). In the mapping result shown in FIG. 6, three stages of area are shown. A first area is an area ("a radio interference permissible location" in FIG. 6) in which a permissible level 1 of a first amplitude probability distribution mask is satisfied. A second area is an area ("an permissible level 1 NG location" in FIG. 6) in which the permissible level 1 is not satisfied but a permissible level 2 of the second amplitude probability distribution mask different from the first amplitude probability distribution mask (namely, the bit error rate is different from each other) is the satisfied. A third area is an area ("an permissible level 2 NG location" in FIG. 6) in which both the permissible level 1 and the permissible level 2 are not satisfied.

In the first example embodiment in which the determination unit 106 compares a single amplitude probability distribution mask with the amplitude probability distribution for each measurement position coordinate and determines the magnitude relation between them, when a noise which has an influence on communication is widely distributed on a measurement space, there is a possibility that it may be difficult to identify the position of the noise generation source in the NG location.

When a plurality of step-by-step permissible value levels are set, it becomes easy to identify the position of the noise generation source because there is a high possibility that the noise generation source exists at the position at which a noise that has a strong influence on communication is detected.

By using the second example embodiment described above, a plurality of the amplitude probability distribution masks to a plurality of the permissible values are set for the measurement object 1 (for example, the wireless communication board) and whereby, the permissible value adequateness can be determined step-by-step.

Further, in this example embodiment, a case in which two amplitude probability distribution masks are set is taken as an example. However, it goes without saying that three or more amplitude probability distribution masks can be set.

[Third Example Embodiment]

A third example embodiment is characterized in that the amplitude probability distribution masks to the permissible values of a plurality of modulation methods are set and the determination result is mapped for each modulation method.

Figure 7:
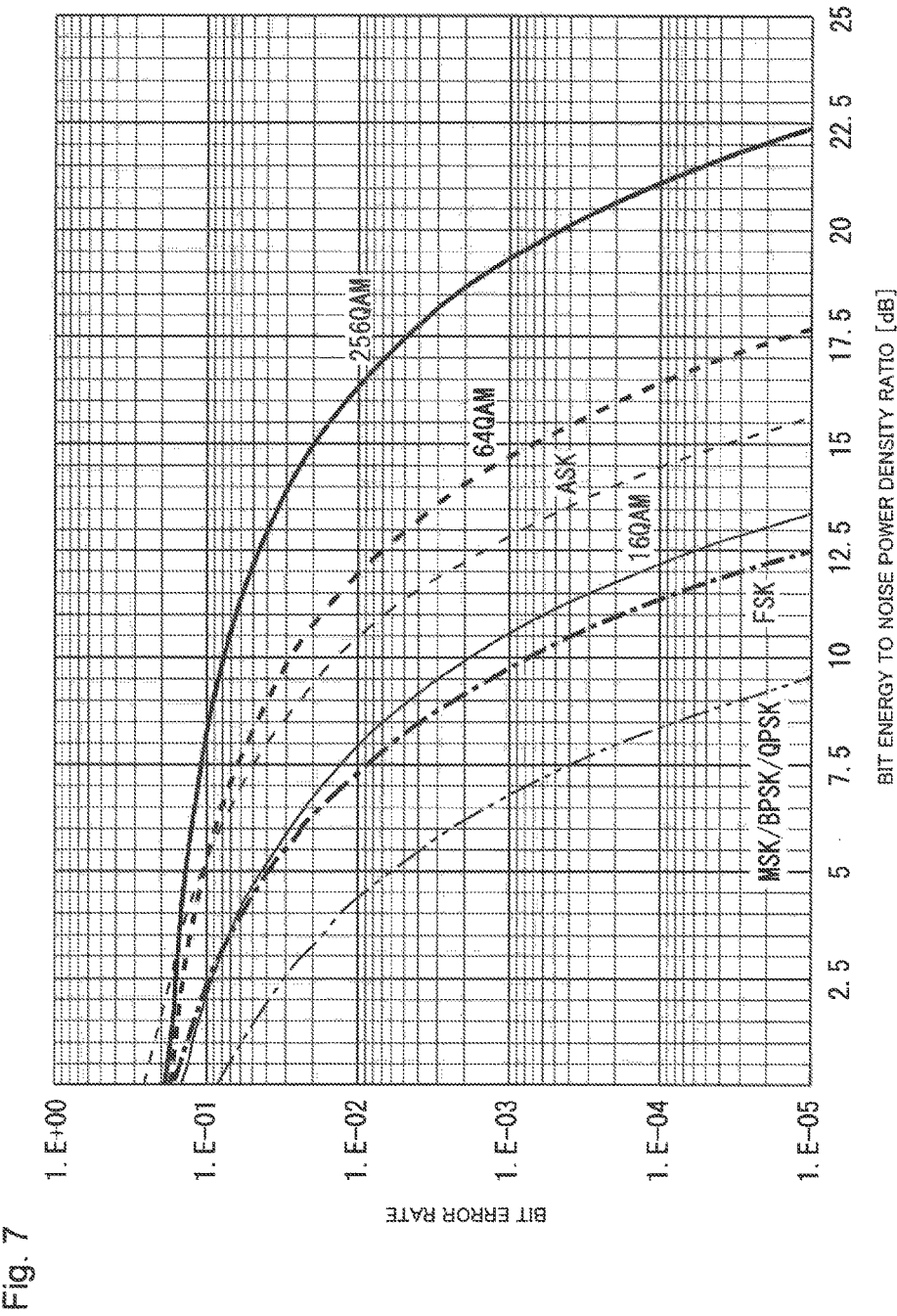
FIG. 7 is a figure showing the theoretical value of bit error rate of various modulation methods.

FIG. 7 is a characteristic graph showing the theoretical bit error rate performance of various modulation methods when the radio interference is regarded as additive Gaussian noise. FIG. 7 is a graph of bit error rate (BER) versus bit energy to noise power density ratio (Eb/No). The graph shows the permissible bit error rate that is theoretically calculated for each modulation method.

As shown in FIG. 7, the bit error rate characteristics of various modulation methods are different from each other and the values of the permissible bit error rate at the same Eb/No value of various modulation methods such as the MSK (Minimum Shift Keying)/BPSK (Binary Phase Shift Keying)/QPSK (Quadrature Phase Shift Keying) modulation method, the FSK (Frequency Shift Keying) modulation method, the 16QAM (Quadrature Amplitude Modulation) modulation method, the ASK (Amplitude-Shift Keying) modulation method, the 64QAM modulation method, and the 256QAM modulation method become larger in this order. Accordingly, the shapes of the amplitude probability distribution masks of various modulation methods set by converting the permissible bit error rate values are different from each other. For this reason, in the wireless communication system using an adaptive modulation method such as an LTE in which a plurality of different modulation methods and a code rate are appropriately used according to a communication environment, the software radio communication system, or the like, it is useful to show the determination result to a plurality of the amplitude probability distribution masks corresponding to a plurality of the modulation methods.

Figure 8:
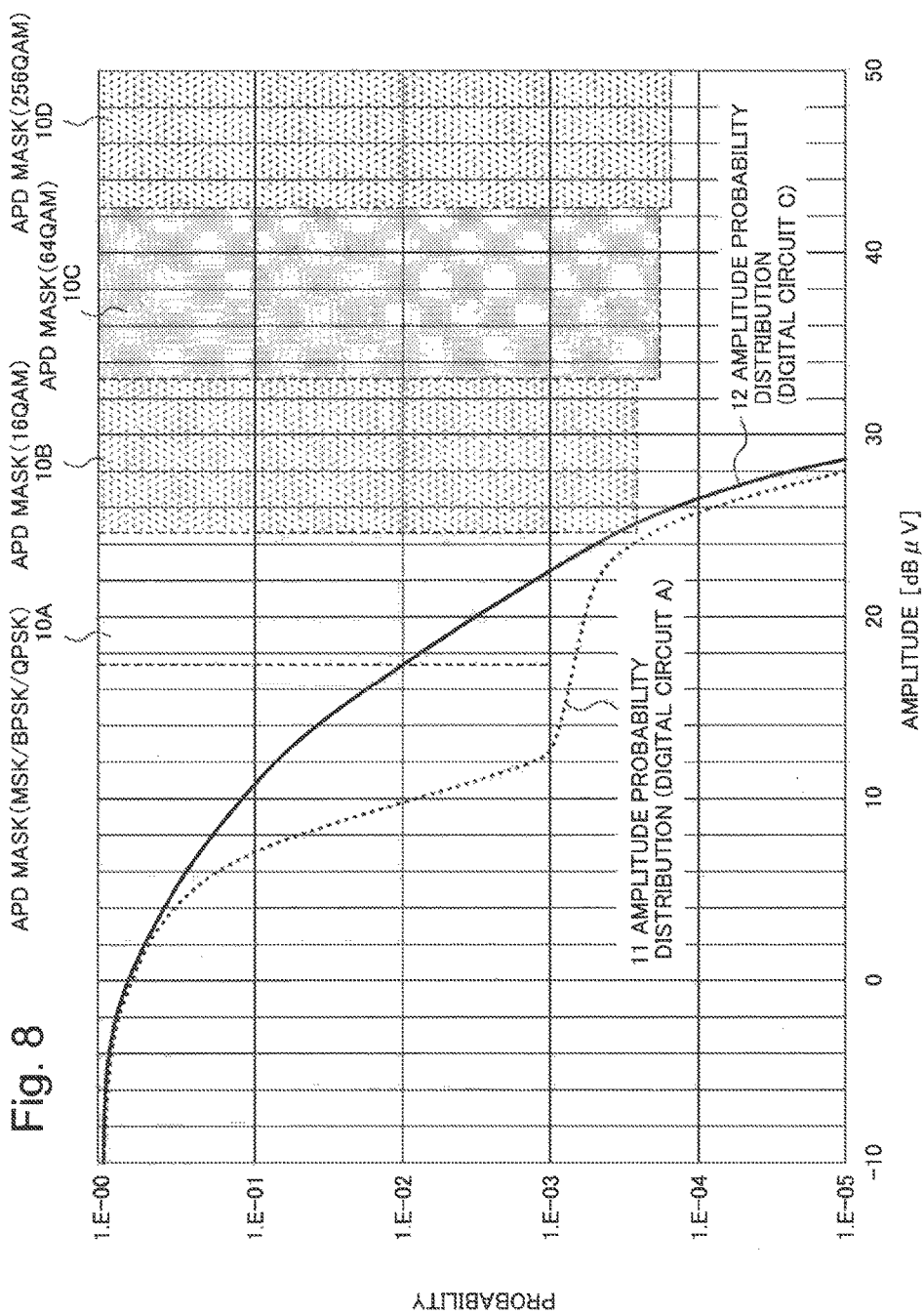
FIG. 8 is a figure showing an image of a magnitude relation determination process performed by a determination unit according to a third example embodiment.

FIG. 8 is a figure showing an image of the magnitude relation determination process performed by the determination unit 106 in the third example embodiment. FIG. 8 shows the amplitude probability distribution 11 in the neighborhood of the digital circuit A and the amplitude probability distribution 12 in the neighborhood of the digital circuit C in the wireless communication board (FIG. 2) that is the measurement object 1 like the first example embodiment. Further, in the upper right part of FIG. 8, four amplitude probability distribution masks: an amplitude probability distribution mask 10A used for a case in which the MSK/BPSK/QPSK modulation method is used in the wireless communication board that is the measurement object 1, an amplitude probability distribution mask 10B used for a case in which the 16QAM modulation method is used in it, an amplitude probability distribution mask 10C used for a case in which the 64QAM modulation method is used in it, and an amplitude probability distribution mask 10D used for a case in which the 256QAM modulation method is used in it are simultaneously set. However, for ease of understanding of a state in which a plurality of different amplitude probability distribution masks that are set for various modulation methods or various operating environments are displayed, FIG. 8 shows an example of the amplitude probability distribution masks. Therefore, in an actual case, the arrangement of the amplitude probability distribution masks of various modulation methods may be different from the arrangement shown in FIG. 8.

As shown in FIG. 8, the curve line of the amplitude probability distribution 11 in the neighborhood of the digital circuit A and the amplitude probability distribution masks of all the modulation methods does not overlap each other at all. In contrast, a part of the curve line of the amplitude probability distribution 12 in the neighborhood of the digital circuit C and the amplitude probability distribution masks 10A and 10B partially overlap (namely, the amplitude of which the amplitude probability exceeds the permissible upper limit value barely exists). The determination unit 106 transmits the determination result indicating whether or not the amplitude probability distribution exceeds the upper limit value determined by each of the amplitude probability distribution masks 10A to 10D of the modulation methods for each measurement position coordinate to the mapping process unit 107.

The user can simultaneously evaluate the adequateness of the permissible value for each modulation method because a plurality of the amplitude probability distribution masks are simultaneously set. Therefore, the user can get the useful knowledge about not only the measures against EMI but also the aspect of system control for selecting the modulation method.

When the degradation of communication performance caused by interference of the radio interference from the measurement object is actually evaluated, a transceiver of a target communication system is prepared and the evaluation is performed while receiving both the transmission radio wave transmitted from the transmitter and the radio interference generated from the measurement object in the receiver side. Further, when the degradation (intra-EMI) of communication performance caused by interference of the radio interference generated from a wireless equipment itself is evaluated, the receiver is regarded as the measurement object and the radio interference source. At this time, when the condition such as the modulation method of the communication system or the like is changed, in general, the measurement has to be performed again as it arises. In contrast, when the electromagnetic radio interference measurement device according to the second example embodiment is used, an advantage in which the influence on the communication system using various modulation methods can be grasped at a time is obtained because the evaluation is performed by using a simple measurement system in which only the radio interference characteristics of the measurement object is used.

Specifically, the mask setting unit 103 sets a plurality of different amplitude probability distribution masks that are obtained by converting a plurality of different bit error rates as the permissible level. The determination unit 106 determines the magnitude relation between a plurality of the amplitude probability distribution mask and the amplitude probability distribution for each measurement position coordinate and outputs the determination result. The mapping process unit 107 acquires the mapping result in which the step-by-step determination result is reflected in the space corresponding to the measurement object 1. The output unit 106 displays the mapping result in which the determination result for each modulation method received from the mapping process unit 107 is reflected in the display device.

FIG. 9 is a figure showing an example of the mapping result in the third example embodiment. In the mapping result shown in FIG. 9, an area ("an radio interference permissible location" in FIG. 9) in which the amplitude probability distribution masks of all the modulation methods to which the masks are set are satisfied, an area ("an MSK/BPSK/QPSK NG location" in FIG. 9) in which the amplitude probability distribution mask 10A used when the MSK/BPSK/QPSK modulation method is used is not satisfied, and an area ("a 16QAM NG location" in FIG. 9) in which the amplitude probability distribution mask 10B used when the 16QAM modulation method is used is not satisfied are shown.

In the third example embodiment described above, even when the measurement object 1 (for example, the wireless communication board) supports a plurality of different communication systems or a plurality of different modulation methods, the adequateness of the allowance for each system or for each modulation method can be determined at a time.

[Fourth Example Embodiment]

A fourth example embodiment is characterized in that when the determination unit 106 compares the amplitude probability distribution mask with the amplitude probability distribution, the determination unit 106 determines a degree of influence on communication based on a size of the area in which the amplitude probability distribution mask and the amplitude probability distribution overlap each other, maps the determination result, and displays the mapping result as an output.

In the fourth example embodiment, a degree of influence is determined in the single amplitude probability distribution mask. In the second and third example embodiments, the step-by-step permissible levels are set by using a plurality of masks. This is a difference between the fourth example embodiment and the second and third example embodiments.

Specifically, when an amplitude probability exceeds the permissible upper limit value, the determination unit 106 quantifies a degree of overlap with the mask and outputs the step-by-step determination result corresponding to the quantified value. The mapping process unit 107 acquires the mapping result in which the step-by-step determination result is reflected in the space corresponding to the measurement object 1. The output unit 106 displays the mapping result in which the step-by-step determination result received from the mapping process unit 107 is reflected in the display device.

The quantified value of a degree of overlap between the amplitude probability distribution mask and the amplitude probability distribution for each measurement position coordinate is used as a parameter for determining the degree of influence on communication. For example, a maximum probability of the amplitude probability distribution which overlaps with the mask and the maximum amplitude value may be used. In the noise whose amplitude probability exceeds the permissible upper limit value, a size of the overlapped area or a length of an overlapped part of the line of the amplitude probability distribution may be quantified. When the value of the maximum probability that indicates a degree of overlap with the mask, the value of the maximum amplitude, or the like is large, it can be determined that it has a large degree of influence among the radio interferences that do not satisfy the permissible level.

When the noise which is frequently generated and has a large degree of influence on communication exists, the amplitude probability distribution of the noise overlaps with the amplitude probability distribution mask in a high probability range. For example, in FIG. 3, the amplitude probability distribution 12 overlaps with the amplitude probability distribution mask 10 in a range of probability from 1E-2 to 1E-3. When another amplitude probability distribution detected at a different position overlaps with the amplitude probability distribution mask 10 in a higher probability range, it is determined that the noise has a larger influence on communication compared to the noise whose amplitude probability distribution is shown by the amplitude probability distribution 12 (the digital circuit C).

As a determination method, a method in which a plurality of areas are determined for each degree of influence in the mask area of the amplitude probability distribution in advance and the mapping taking into account the degree of influence when the overlap with the predetermined area occurs or when the size of the overlapped area is maximum is performed may be used.

Further, a method in which the size of the degree of influence is ranked according to the size of the maximum probability or the like which overlaps with the mask in the amplitude probability distribution of the radio interference that exceeds the amplitude probability distribution mask to classify the degree of influence into an arbitrary number of stages and the mapping taking into account the stages is performed may be used.

Here, with respect to the characteristics of the radio interference to communication, it's a matter of course that the amplitude intensity of the radio interference has to be equal to or less than the permissible level. However, when the amplitude intensity is high, the degree of influence on communication is not necessarily large. It is considered that the degree of influence of the noise whose amplitude exceeds the permissible value on communication hardly depends on the size of the amplitude intensity among the noises whose occurrence frequencies are equal to each other. Therefore, even when the maximum amplitude value is used when the degree of overlap with the amplitude probability distribution mask is quantified, it may not necessarily reflect the degree of influence on communication.

On the other hand, when the probability of the amplitude probability distribution is high, the occurrence frequency of the noise is high and the degree of influence on communication is high. For this reason, when the degree of overlap with the amplitude probability distribution mask is quantified, the degree of overlap is quantified by using a parameter related to the probability rather than the amplitude, for example the probability is weighted or another method is used. In this way, the degree of influence on communication that reflects the current state can be set.

Further, in the second and third example embodiments, a plurality of the amplitude probability distribution masks are used. The same manner can be used in the fourth example embodiment.

[Other Example Embodiments]

The present invention may be realized by combining with a general method such as a mapping in which the maximum amplitude intensity obtained by a spectrum measurement is mapped, a mapping in which a board layout is overlaid, or the like as a method for measuring the electromagnetic near-field distribution.

Further, each of the function units of the electromagnetic radio interference measurement device 100 shown in FIG. 1 may be composed of only hardware as means for realizing each function of the function units and each function used for the electromagnetic radio interference measurement method may be realized by any means that can realize each function.

Further, a process of each function unit may be performed by recording a program for realizing all or a part of the function according to the example embodiment described above in a computer-readable recording medium, reading out the program recorded in this recording medium and storing it in a computer system, and executing the program.

For example, a CPU (Central Processing Unit) is an example of the "computer system".

For example, a non-temporary storage device is an example of the "computer-readable recording medium". For example, a portable medium such as a magnet-optical disk, a ROM (Read Only Memory), a nonvolatile semiconductor memory, or the like and a hard disk built in the computer system are examples of the non-temporary storage device. Further, the "computer-readable recording medium" may be a temporary storage device. For example, a communication line used when the program is transmitted through a network such as the Internet or the like and a communication line such as a telephone line or the like or a volatile memory inside the computer system is an example of the temporary storage device.

Further, the above-mentioned program may be a program for realizing a part of the function described above or a program for realizing the function described above by a combination with the program preliminarily recorded in the computer system.

The invention of the present application has been described above with reference to the example embodiment. However, the technical scope of the present invention is not limited to the above-mentioned example embodiment. It is obvious that various changes or improvements can be made to each example embodiment by those skilled in the art. Accordingly, it goes without saying that the example embodiments to which various changes and improvements are applied are also included in the technical scope of the present invention. A reference sign, a numerical value, a name of the component, or the like used in each example embodiment described above is shown as an example. Therefore, it can be appropriately changed. For example, the function block configuration can be changed by the separation or combination of the function blocks and also, the order of executing the processes can be changed. These changes can be freely performed without departing from the intent of the present invention and the functional range mentioned above.

INDUSTRIAL APPLICABILITY

The present invention can be suitably applied to a measurement device which estimates the influence of an electromagnetic radio interference on a wireless communication system in a measurement evaluation of an radio interference emitted from a general electronic device such as home electronics or the like and an environmental adaptability test. By using the electromagnetic radio interference measurement method, the knowledge for efficiently taking the measures against EMI can be obtained.

The present invention has been described above by using the example embodiment mentioned above as an exemplary example. However, the present invention is not limited to the example embodiment mentioned above. Namely, on the basis of the present invention, various embodiments that can be understood by those skilled in the art can be used without departing from the scope of the invention of the present application.

This application claims priority from Japanese Patent Application No. 2014-149586 filed on Jul. 23, 2014, the disclosure of which is hereby incorporated by reference in its entirety.

REFERENCE SIGNS LIST 1 measurement object
2 probe
10 amplitude probability distribution mask
10A amplitude probability distribution mask of MSK/BPSK/QPSK modulation method
10B amplitude probability distribution mask of 16QAM modulation method
10C amplitude probability distribution mask of 64QAM modulation method
10D amplitude probability distribution mask of 256QAM modulation method
11 amplitude probability distribution
12 amplitude probability distribution
20 amplitude probability distribution mask
100 electromagnetic radio interference measurement device
101 acquisition unit
102 amplitude probability distribution calculation unit
103 mask setting unit
104 control unit
105 storage unit
106 determination unit
107 mapping process unit
108 output unit
109 probe scanning device

The invention claimed is:

1. An electromagnetic radio interference measurement device that measures an electromagnetic near-field emitted from a measurement object and evaluates electromagnetic interference, the device comprising:
    mask setting unit that converts a predetermined communication performance value permitted in a desired communication system or a modulation method that is arbitrarily designated into an amplitude probability distribution mask and setting a converted amplitude probability distribution mask as a permissible level;
    acquisition unit that acquires time-series measurement data of electromagnetic radio interference emitted from the measurement object in connection with a measurement position coordinate;
    amplitude probability distribution calculation unit that calculates amplitude probability distribution of the electromagnetic radio interference for each measurement position coordinate based on the time-series measurement data;
    determination unit that determines a magnitude relation between the amplitude probability distribution mask and the amplitude probability distribution for each measurement position coordinate and outputting as a determination result;

mapping process unit that acquires a mapping result in which the determination result is reflected in a space corresponding to the measurement object, and output unit that outputs the mapping result.

2. The electromagnetic radio interference measurement device according to claim 1, wherein the mask setting unit sets each of a plurality of different amplitude probability distribution masks as a permissible level, the plurality of different amplitude probability distribution masks being obtained by converting a plurality of different communication performance values, respectively, the determination unit determines magnitude relations between respective ones of the plurality of amplitude probability distribution masks and the amplitude probability distribution for each measurement position coordinate and outputs a step-by-step determination result, and the mapping process unit acquires a mapping result in which the step-by-step determination result is reflected in a space corresponding to the measurement object.

3. The electromagnetic radio interference measurement device according to claim 1, wherein the determination unit determines the magnitude relation between the amplitude probability distribution mask and the amplitude probability distribution for each measurement position coordinate, determines step-by-step a degree of influence on communication for each measurement position coordinate depending on a degree of overlap between the amplitude probability distribution mask and the amplitude probability distribution, and outputs a result as a step-by-step determination result, and the mapping process unit acquires the mapping result in which the step-by-step determination result is reflected in the space corresponding to the measurement object.

4. The electromagnetic radio interference measurement device described in claim 1, wherein the communication performance value is a bit error rate.

5. An electromagnetic radio interference measurement method for use in an electromagnetic radio interference measurement device which measures a electromagnetic near-field emitted from a measurement object and evaluates electromagnetic interference comprising:

converting a predetermined communication performance value permitted in a desired communication system or a modulation method that is arbitrarily designated into an amplitude probability distribution mask and setting a converted amplitude probability distribution mask to a permissible level;

acquiring time-series measurement data of the electromagnetic radio interference emitted from the measurement object in connection with a measurement position coordinate;

calculating an amplitude probability distribution of the electromagnetic radio interference for each measurement position coordinate based on the time-series measurement data;

determining a magnitude relation between the amplitude probability distribution mask and the amplitude probability distribution for each measurement position coordinate and outputting a result as a determination result;

acquiring a mapping result in which the determination result is reflected in a space corresponding to the measurement object; and outputting the mapping result.

6. The electromagnetic radio interference measurement method described in claim 5, wherein in the setting of the permissible level of the mask as a permissible level, the plurality of different amplitude probability distribution masks being obtained by converting a plurality of different communication performance values, respectively, in the determination of the magnitude relation, the magnitude relation between respective ones of the plurality of amplitude probability distribution masks and the amplitude probability distribution is determined for each measurement position coordinate and the step-by-step determination result is outputted, and in the acquisition of the mapping result, the mapping result in which the step-by-step determination result is reflected in the space corresponding to the measurement object is acquired.

7. The electromagnetic radio interference measurement method described in claim 5, wherein in the determination of the magnitude relation, the magnitude relation between the amplitude probability distribution mask and the amplitude probability distribution is determined for each measurement position coordinate, a degree of influence on communication is step-by step determined for each measurement position coordinate depending on a degree of overlap between the amplitude probability distribution mask and the amplitude probability distribution, and a result is outputted as the step-by-step determination result, and in the acquisition of the mapping result, the mapping result in which the level-by-level determination result is reflected in the space corresponding to the measurement object is acquired.

8. The electromagnetic radio interference measurement method according to claim 5, wherein the communication performance value is a bit error rate.

9. A non-transitory computer readable recording medium recording an electromagnetic radio interference measurement program which causes a computer of an electromagnetic radio interference measurement device, which measures an electromagnetic near-field emitted from a measurement object and evaluates electromagnetic interference, to perform:

a mask setting process converting a predetermined communication performance value permitted in a desired communication system or a modulation method that is arbitrarily designated into an amplitude probability distribution mask and setting a converted amplitude probability distribution mask as a permissible level, an acquiring process for acquiring time-series measurement data of the electromagnetic radio interference emitted from the measurement object in connection with a measurement position coordinate, an amplitude probability distribution calculation process calculating an amplitude probability distribution of the electromagnetic radio interference for each measurement position coordinate based on the time-series measurement data, a determination process determining a magnitude relation between the amplitude probability distribution mask and the amplitude probability distribution for each measurement position coordinate and outputting as a determination result, a mapping process acquiring a mapping result in which the determination result is reflected in a space corresponding to the measurement object, and an output process outputting the mapping result.

* * * * *